US005959843A

United States Patent [19]
Kurrer et al.

[11] Patent Number: 5,959,843
[45] Date of Patent: Sep. 28, 1999

[54] FRONT SYSTEM FOR A PRINTED CIRCUIT BOARD ASSEMBLY HAVING ACTIVE-PASSIVE SWITCHING

[75] Inventors: Siegfried Kurrer, Nuremberg; Werner Koerber, Betzenstein; Ernst Billenstein, Burgbernheim; Kurt-Michael Schaffer, Eckental, all of Germany

[73] Assignee: Siemens Aktiengesellschaft, Munich, Germany

[21] Appl. No.: 08/924,997

[22] Filed: Sep. 5, 1997

Related U.S. Application Data

[63] Continuation of application No. PCT/DE95/01080, Aug. 16, 1995.

[30] Foreign Application Priority Data

Jun. 12, 1995 [DE] Germany ......... 295 09 603 U

[51] Int. Cl.⁶ .................................... H05K 7/14
[52] U.S. Cl. ................. 361/754; 361/759; 361/752; 361/798; 361/801; 439/157; 439/911; 200/292
[58] Field of Search ............ 361/740, 748, 361/754, 759, 798, 801, 781; 439/157, 160, 911; 200/292

[56] References Cited

U.S. PATENT DOCUMENTS

| | | |
|---|---|---|
| 4,885,436 | 12/1989 | Pham et al. . |
| 5,289,347 | 2/1994 | McCarthy et al. . |
| 5,675,475 | 10/1997 | Mazura et al. ................. 361/798 |

FOREIGN PATENT DOCUMENTS

| | | |
|---|---|---|
| B0194515 | 9/1986 | European Pat. Off. . |
| A0304772 | 3/1989 | European Pat. Off. . |
| A0313270 | 4/1989 | European Pat. Off. . |
| A0369025 | 5/1990 | European Pat. Off. . |
| A0534674 | 3/1993 | European Pat. Off. . |
| 0579859 | 1/1994 | European Pat. Off. . |
| A2746319 | 4/1978 | Germany . |
| A4105948 | 8/1992 | Germany . |
| C19507712 | 4/1996 | Germany . |
| A2298741 | 9/1996 | United Kingdom . |

OTHER PUBLICATIONS

Honeywell Outline, Sensorik und Automation, vol. 9, Issue 1, pp. 10, 12.

*Primary Examiner*—Leo P. Picard
*Assistant Examiner*—Jayprakash N. Gandhi
*Attorney, Agent, or Firm*—Sughrue, Mion, Zinn, Macpeak & Seas, PLLC

[57] ABSTRACT

The front system has an upper and a lower end piece (5) which are fastened to the upper and lower front corner region (3), respectively, of the printed circuit board assembly (3). An upper and/or a lower lever pull handle (19), which is fitted to the upper and/or lower end piece respectively, is used for levering the printed circuit board assembly into and out of the mounting rack. A latching mechanism (25) is provided to fix the lever pull handle in the appropriate position when the printed circuit board assembly has reached the point where it has been fully inserted into the mounting rack. A switching element (31) is integrated in the upper and/or lower end piece in such a manner that the switching element is actuated by the lever pull handle when it is in its fixed position. By this means, the printed circuit board assembly can be electrically enabled. The invention has the advantage that, as a result of its integration into the lower and/or upper end piece, the switching element can be moved to an accurately definable position. It is thus possible to permanently and reliably actuate the switching element with the lever pull handle even when an actuator of the switching element has only a small switching path.

18 Claims, 3 Drawing Sheets

FRONT SYSTEM FOR A PRINTED CIRCUIT BOARD ASSEMBLY HAVING ACTIVE-PASSIVE SWITCHING

This is a Continuation of International Application PCT/DE95/01080, with an international filing date of Aug. 16, 1995, the disclosure of which is incorporated into this application by reference.

FIELD OF AND BACKGROUND OF THE INVENTION

The invention relates to new and useful improvements in a front system for a printed circuit board. More particularly, the invention relates to a front system having one or more lever pull handles for affixing the front system to a mounting rack.

EP 0 304 772 B1 discloses a front plug system for a flat structural component (printed circuit board) having an end contact device. In this case, a front plug connector can be plugged onto a front element which is located at the end of a printed circuit board assembly. This is carried out by means of a pivot movement, in that the front plug connector can be attached into a pivot bearing at one end of the front element. Located at the other end of the front element and front plug connector is an end contact device which does not engage until after the front plug connector is attached completely to the front element. The engagement is achieved through operation of a closure device, which is preferably provided by a screw that is likewise inserted into the other end of the front plug connector, so that the operating contacts of the end contact device do not engage until the screw has been screwed completely into an oppositely located thread in the front element, and the front element has thereby been attached completely. In this way, it is possible to ensure that the electrical signals which are passed via the front element and the front plug connector are not released until all the contacts between the front element and the front plug connector have been closed, this release of the electrical signals taking place simultaneously. Conversely, it ensures that the front plug connector is restricted before one of the contacts is interrupted when the front plug connector is pivoted away.

Printed circuit board assemblies can be levered into and out of the plug-in slot in a mounting rack by means of insertion and withdrawal aids such as those known, e.g., from EP 0 194 515 B1. However, even in the case of such printed circuit board assemblies that can be levered in and out, it is sometimes necessary to bring about organized release and/or interruption of the entire signal exchange, which proceeds via their rear plug connectors to a mounting rack motherboard and a data bus located there. Thus, e.g., at the start of levering out a printed circuit board assembly, it is desirable to bring about complete interruption of the signal exchange to and from the printed circuit board assembly without having to disconnect the contact between the plug connector and the motherboard, even though other contacts are not yet disconnected.

In order to solve this problem, the document Honeywell Outline, Sensors and Automation, Year 9, Issue 1, pages 10, 12 proposes, in the article "Leiterplattenausbau ohne Systemunterbrechung mit Honeywell Schaltern und Sensoren" [Printed circuit board removal without system interruption using Honeywell switches and sensors] that, for example, a switch be fitted to the edge of the printed circuit board, either on its top or bottom, and be connected to the main power supply, e.g. via appropriate conductor tracks. An interlocking mechanism, which fixes the printed circuit board in its position in the mounting rack, acts on the switch. In the interlocked state, a bolt of the interlocking mechanism rests on that edge of the printed circuit board to which the switch is fitted and causes the switch to operate, and thus causes electrical activation of the printed circuit board. If, in contrast, the bolt is pivoted away from the edge, then the switch is interrupted and the printed circuit board is switched to be electrically inactive. An infrared component can also be used instead of the switch.

OBJECTS OF THE INVENTION

A major problem with such devices is the fact that precise positioning of the switch on the edge of the printed circuit board is extraordinarily difficult. If, for example, the switch is soldered to appropriate conductor tracks on the printed circuit board surface, then, because of the soldering process, it is difficult to ensure that the switching lever, particularly in the case of a miniature switch, can be positioned sufficiently accurately that it is operated correctly when the bolt comes to rest on the edge of the printed circuit board.

One object of the invention, therefore, is providing a front system for a printed circuit board assembly equipped with electrical active-passive switching for the printed circuit board that is both precise and durable. A further object of the invention is providing a front system of elegant design that is both easy to operate and reliable.

SUMMARY OF THE INVENTION

These and other objects are achieved by the teaching of the independent claims. Further advantageous embodiments of the invention are defined in the dependent claims.

BRIEF DESCRIPTION OF THE DRAWINGS

The invention and preferred embodiments thereof are explained in greater detail by means of the examples illustrated in the figures, in which.

DETAILED DESCRIPTION OF THE PREFERRED EMBODIMENTS

Figure 1:
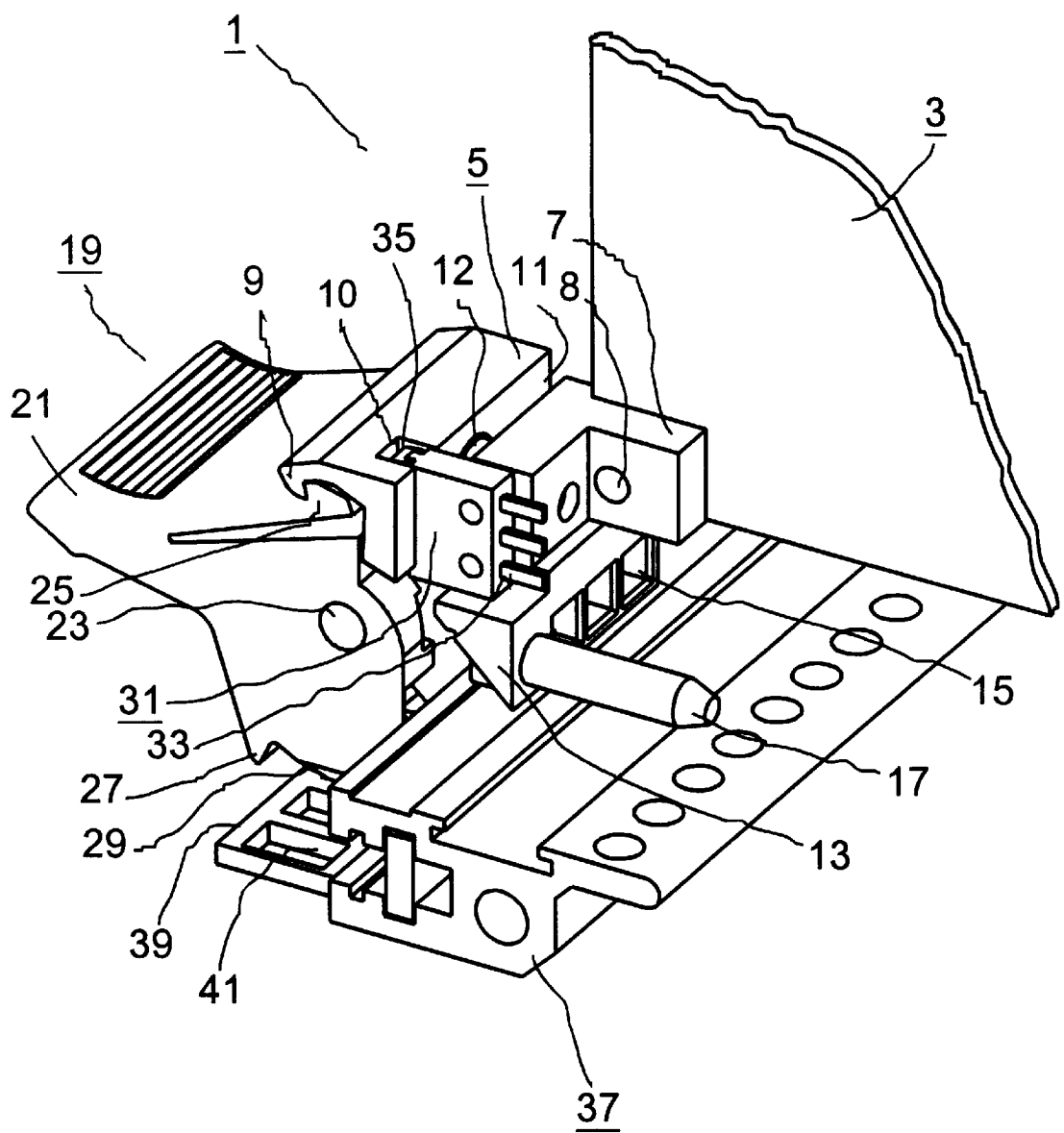
FIG. 1 shows a perspective side view of a lower transverse rail of a mounting rack and of a lower end piece, designed according to the invention, for a front panel of a printed circuit board having a lever pull handle.

FIG. 1 shows a perspective side view of the lower, front end region 1 of a front system, designed according to the invention, for a printed circuit board assembly 3. The printed circuit board assembly 3 is shown in FIG. 1 in the form of a representative lower, front corner region thereof. The lower end region 1 in this case rests on the lower transverse rail 37 of a mounting rack. The main components of the lower, front end region 1 of the front system are a lower lever pull handle 19, a lower end piece 5, and a front panel, which is not shown in FIG. 1. The lower end piece 5 has a central retaining function since it is used, on the one hand, as a support for the lever pull handle 19, which is mounted, in particular, via a hole 23 and an associated pin (not shown), such that it can rotate. On the other hand, the lower end piece 5 is also used for holding the lower end of the front panel, which is advantageously pushed into a groove 11 and is held via a screw that engages with a hole 12. The connection between the lower end piece 5 and the front, lower corner of the printed circuit board assembly is preferably achieved by a retaining block 7 and by means of a screw which engages a hole 8 therein.

Further components can be fitted onto the end piece 5. The end piece illustrated in FIG. 1 thus includes a coding block 13, into which coding chambers 15 are incorporated for inserting coding pins. These coding pins can contact other coding chambers, which are positioned in an opposing relationship on the lower transverse support 37 and are similarly fitted with complementary-coded coding pins. In this way, it is possible to ensure that only a specific, selected printed circuit board assembly can be positioned in a given plug-in slot in the mounting rack. Finally, there is also a guide pin 17 that is received by an opposing guide hole, thereby ensuring that the printed circuit board assembly is inserted correctly, without tilting.

A lower lever pull handle 19, which can be operated by operating the handle part 21, is used for levering the printed circuit board assembly 3 into and out of the corresponding plug-in slot. While the printed circuit board assembly 3 is being levered out, the handle must be pressed downwards so that at least one levering-out tab 27, projecting from the bottom of the handle, rests on an end edge 39 of the lower transverse rail 37. Conversely, while the printed circuit board assembly is being levered in, the handle must be pressed upwards so that at least one levering-in edge 29, which likewise projects from the underside of the handle, can be supported in the interior of at least one engagement cutout 41. As evident from FIG. 1, the engagement cutouts 41 are likewise located in the region of the end edge 39 of the lower transverse rail 37.

Normally, there is also provided some mechanism on the end piece 5 by means of which the lever pull handle 19 is fixed in the appropriate position, once the printed circuit board assembly 3 has reached the point at which it is inserted into the mounting rack completely. For this purpose, as illustrated in FIG. 1, the lever pull handle 19 advantageously has a latching tab 25 on its upper surface. This latching tab 25 is preferably mounted resiliently and is directed towards the end piece 5 such that it projects upwards and engages behind a latching edge 9 on the lower end piece 5. The latching edge 9, conversely, is directed towards the lever pull handle 19 and points downwards so that it can clasp the latching tab 25.

Although not illustrated in FIG. 1, a corresponding arrangement, composed of an upper end piece with an upper lever pull handle mounted on it, such that it can rotate, is fitted in the same manner to the front, upper corner region of the printed circuit board assembly 3. This upper lever pull handle engages in a corresponding upper transverse rail of a mounting rack for levering the front system in and out.

According to the invention, a switching element is integrated into the lower and/or upper end piece in such a way that the switching element is actuated by its associated lever pull handle 19 when the handle reaches its latched position. In this way, the printed circuit board assembly can be rendered electrically active, for example by activation of its power supply. On the other hand, the printed circuit board assembly can be switched to be electrically passive when the printed circuit board assembly is levered out. More specifically, the printed circuit board assembly is rendered electrically passive at the moment when the lever pull handle ceases to engage the integrated switching element. Thus, for example, the release of the switching element by the lever pull handle can cause the electrical power supply to the printed circuit board assembly to be made passive.

By way of a first example, FIG. 1 shows a switching element 31 which is integrated into the lower end piece 5. This switching element 31 is mounted in a retaining slot 10 which extends into the region of the latching edge 9 of the end piece 5. A switching part (concealed and thus not visible in FIG. 1) of the switching element, for example a switching lever, projects into the region below the downwardly pointing latching edge 9. Accordingly, the switching part is actuated when the lever pull handle reaches the latched position, by the impact of its rear side against the switching element. In the embodiment of FIG. 1, this operation is carried out by the end of the latching tab 25 that faces the lower end piece 5. Preferably, the integrated switching element 31 is electrically connected to the printed circuit board assembly 3 via a cable connection or cable plug connection that is fitted to connecting contacts 33 of the switching element 25. However, other types of connections are also possible. Therefore, the connecting contacts can, for example, be drawn down in the form of wires to the surface of the printed circuit board assembly 3 and be soldered in holes present therein.

The active-passive switching according to the invention has the advantage that the switching element 31 can be moved very exactly into a precisely definable position as a result of its integration into the lower or upper end piece of the front system. It is therefore also possible to operate the switching element durably, reliably and without significant wear. This is especially the case if the switching means of the switching element has only a very limited range of movement for switching. Furthermore, the switching is achieved by means of an already existing element, namely the lever pull handle. Finally, since the active-passive switching function is completely integrated within the inventive front system, users of such front system are not subject to any restrictions at all regarding the positioning of components on the printed circuit board assembly. In particular, no dimensionally accurate position stipulations regarding electrical connections for the switching element are required.

Figure 2:
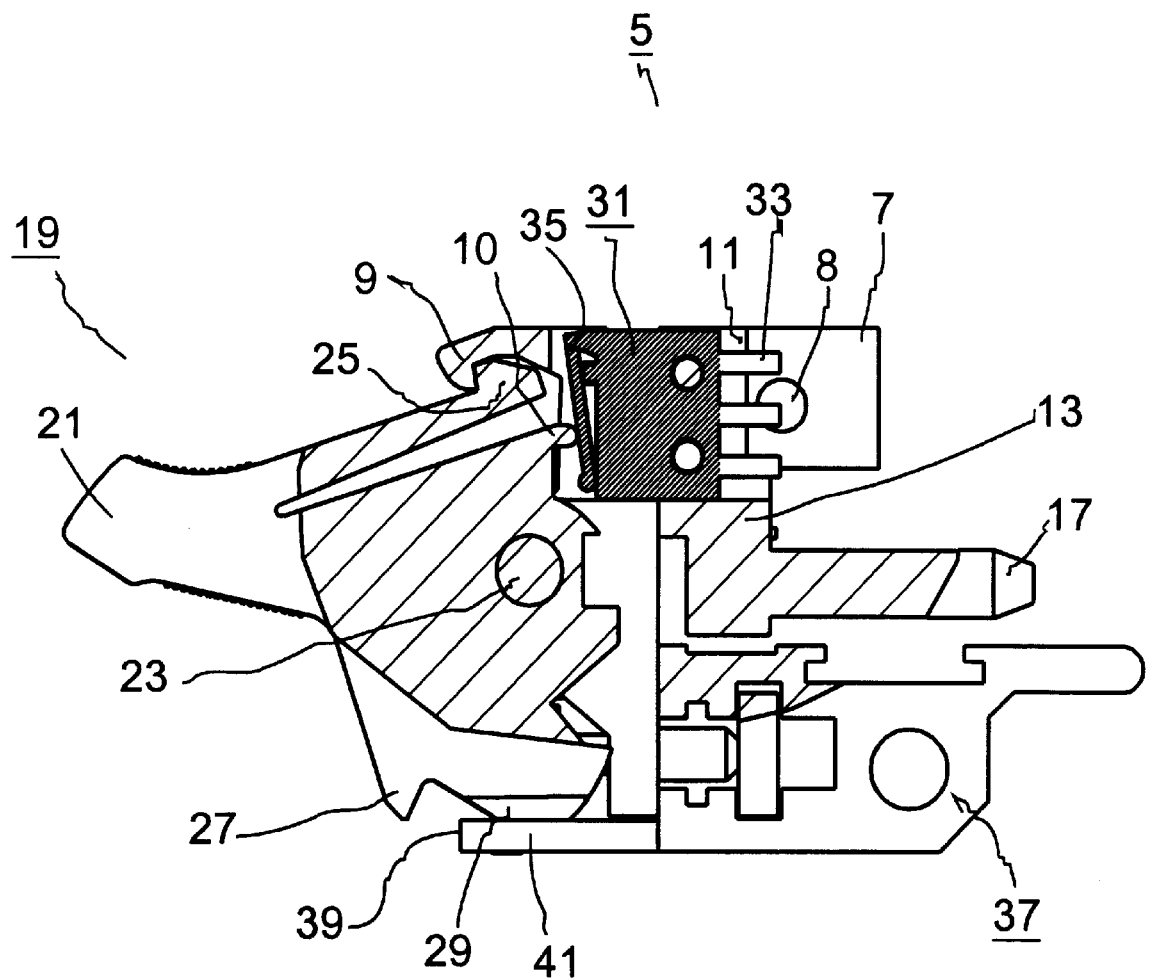
FIG. 2 shows a sectional view through the structure illustrated in FIG. 1, with a snap-action switch provided as an integrated switching element.

The integrated switching element 31 is advantageously embodied as a so-called snap-action microswitch. The snap-action microswitch is preferably actuated via a switching member provided on the lever pull handle. FIG. 2 shows a design of this type by way of a sectional illustration taken through the end region of the front system. The switching lever 55 of the integrated snap-action microswitch 51 in this case is operated by a switching member 50 which takes the form of a bead that is situated on the rear side of the lever pull handle 19 facing the end piece 5. The switching lever 55 confronts the bead 50 of the lever pull handle 19 and is placed in a closed switch position when the lever pull handle 19 is in the fully latched position.

Figure 3:
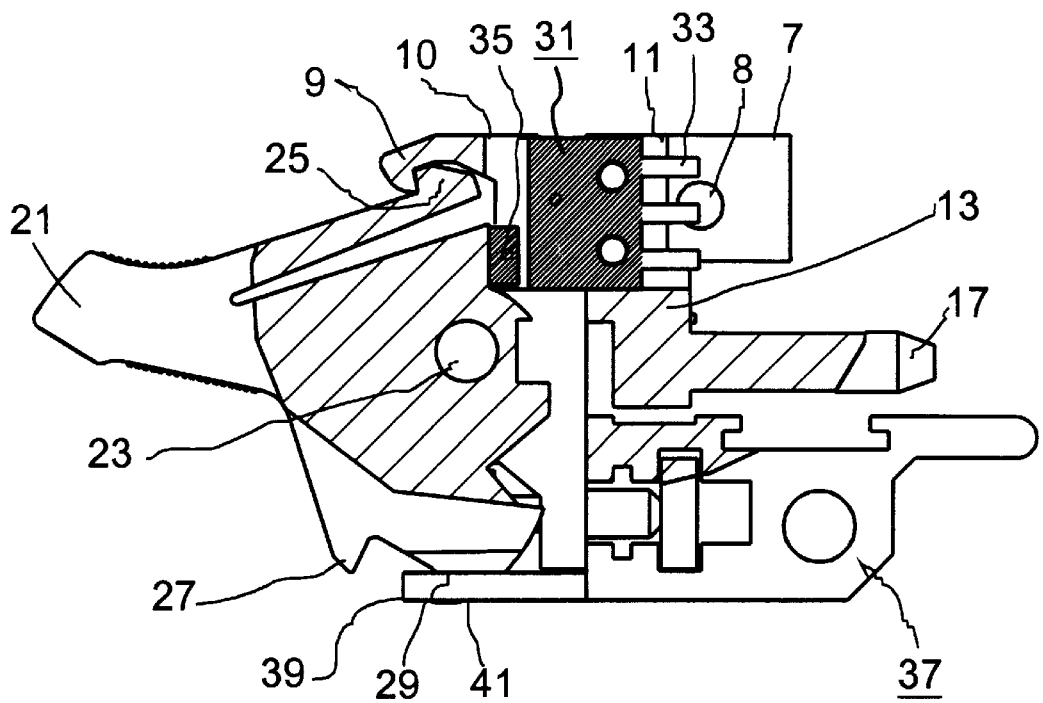
FIG. 3 shows a sectional view through the structure illustrated in FIG. 1, except that a Ball effect sensor and a magnet are provided as the integrated switching element.

According to the invention, components based on other switching principles can be integrated as switching elements in the end piece of front systems according to other embodiments. For instance, a Hall effect sensor can be used as the switching element. FIG. 3 shows an example of this type, where a magnet 65 which is fitted onto or recessed into the rear side of the lever pull handle 19 is used as the switching member. The Hall effect sensor 61 switches when the magnet 65, on reaching the fixed end position illustrated in FIG. 3, has approached the sensor 61 to a sufficient extent. The moment of switching corresponds to the moment when the printed circuit board assembly has been inserted completely into the mounting rack.

Figure 4:
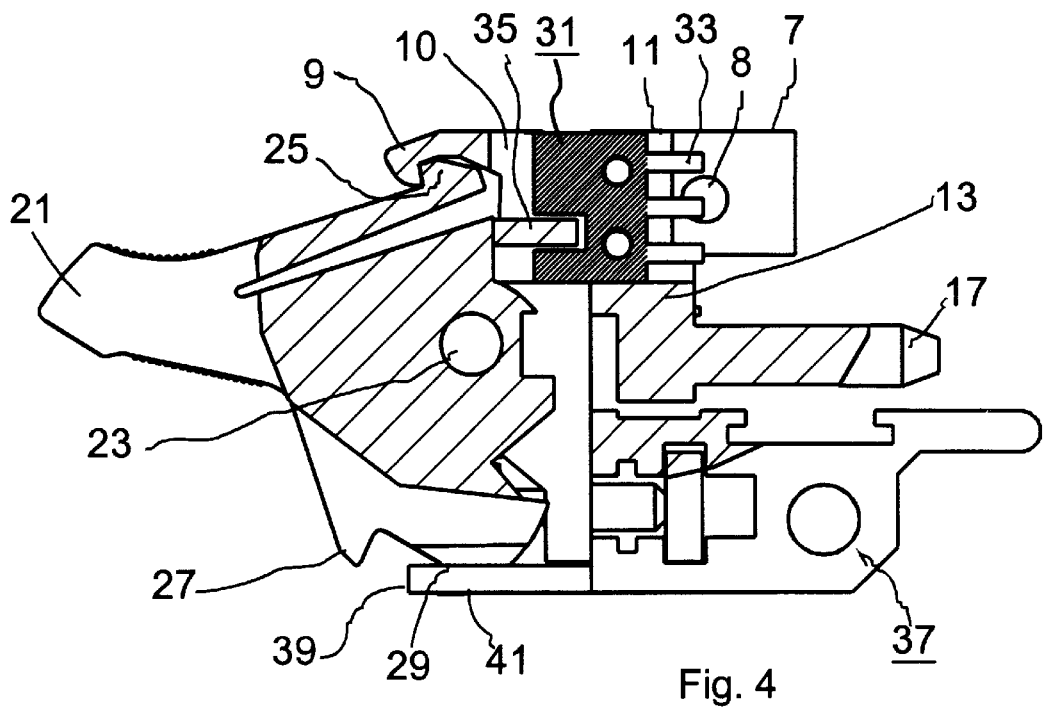
FIG. 4 shows a sectional view through the structure illustrated in FIG. 1, except that a light barrier is provided as the integrated switching element.

Yet another design of the invention is illustrated in FIG. 4. The integrated switching element used there is a light barrier 71. A switching member 75, which is once again fitted to the rear side of the lever pull handle 19, breaches a light path of the light barrier 71 in a shading manner at the moment when the lever has reached its latched position. This is the case when the levering-in operation of the printed circuit board assembly has been concluded and the latter has reached its final, fully inserted position within the mounting rack.

The above description of the preferred embodiments has been given by way of example. From the disclosure given, those skilled in the art will not only understand the present invention and its attendant advantages, but will also find apparent various changes and modifications to the structures disclosed. For example, the positioning of the switching member can be varied, so long as the switching member can cause the integrated switching element to switch between electrically active and passive states in correspondence with the lever pull handle moving between fully latched and less than fully latched positions. Thus, while it is preferable to provide the switching member on an upper portion of the rear surface of the lever pull handle near the latching tab, it is not necessarily critical to do so. It is sought, therefore, to cover all such changes and modifications as fall within the spirit and scope of the invention, as defined by the appended claims, and equivalents thereof.

What is claimed is:

1. Apparatus, comprising:
   a) an end piece fastened to a front corner region of a printed circuit board assembly, said end piece comprising a first latching element;
   b) a lever handle pivotable between a latched position and an unlatched position for levering the printed circuit board assembly into and out of a mounting rack, said lever handle comprising a second latching element;
   c) a switching element affixed to said end piece for selectively electrically activating and deactivating the printed circuit board assembly; and
   d) a switching member provided on said lever handle; wherein:
   said first latching element engages said second latching element in the latched position;
   said first latching element fails to engage said second latching element in the unlatched position; and
   said switching member is disposed in a position for switching said switching element from a first switching state to a second switching state when said lever handle pivots from the unlatched position to the latched position.

2. Apparatus according to claim 1, wherein said switching element is integrated in said end piece.

3. Apparatus according to claim 1, wherein said end piece has an orifice into which said switching element is affixed.

4. Apparatus according to claim 1, wherein said switching member comprises a surface portion of said second latching element.

5. Apparatus according to claim 1, wherein:
   said switching element comprises a microswitch; and
   said switching member comprises a surface projection of said lever handle.

6. Apparatus according to claim 1, wherein:
   said switching element comprises a Hall effect sensor; and
   said switching member comprises a magnet.

7. Apparatus according to claim 1, wherein:
   said switching element comprises a light barrier; and
   said switching member comprises an opaque element.

8. Front panel system, comprising:
   a) a front element fastened to a printed circuit board assembly, said front element comprising a first latching element;
   b) a lever handle pivotable between a latched position and an unlatched position for levering the printed circuit board assembly into and out of a mounting rack, said lever handle comprising a second latching element;
   c) a switching element affixed to said front element and arranged to activate the printed circuit board assembly in a first switching state and to deactivate the printed circuit board assembly in a second switching state; wherein:
   said first latching element engages said second latching element in the latched position;
   said first latching element fails to engage said second latching element in the unlatched position; and
   said lever handle is disposed in a position for switching said switching element from the second switching state to the first switching state when said lever handle pivots from the unlatched position to the latched position.

9. Front panel system according to claim 8, wherein said front element has an orifice into which said switching element is affixed.

10. Front system, comprising:
    a) an upper and a lower end piece which are fitted to an upper and a lower front corner region, respectively, of a printed circuit board assembly;
    b) a lever pull handle, which is fitted to one of said upper and said lower end piece, for levering the printed circuit board assembly into and out of a mounting rack, said lever pull handle having means by which said lever pull handle is fixed in a latched position when the printed circuit board assembly is in a fully inserted position in the mounting rack; and
    c) a switching element integrated in said one end piece such that said switching element is actuated by said lever pull handle when said lever pull handle is in the latched position.

11. Front system according to claim 10, wherein said one end piece has a retaining slot for receiving and mounting said integrated switching element.

12. Front system according to claim 10, wherein:
    said one end piece comprises a latching edge;
    said lever pull handle comprises a latching tab; and in the fully inserted position of the printed circuit board assembly in the mounting rack, said latching tab clasps behind said latching edge.

13. Front system according to claim 12, wherein said integrated switching element is actuated by said latching tab of said lever pull handle.

14. Front system according to claim 10, wherein:
    said integrated switching element comprises connecting contacts.

15. Front system according to claim 10, wherein said integrated switching element is a snap-action microswitch.

16. Front system according to claim 15, wherein said snap-action microswitch is actuated by a switch actuator contacting and actuated by said lever pull handle when said lever pull handle is in the latched position.

17. Front system according to claim 10, wherein:

said integrated switching element is a Hall effect sensor;

a magnet is fitted to said lever pull handle to confront said Hall effect sensor when said lever pull handle is in the latched position; and said magnet actuates said Hall effect sensor when said lever pull handle is in the latched position.

18. Front system according to claim 10, wherein:

said integrated switching element is a light barrier;

a switching member is fitted to said lever pull handle to confront said light barrier when said lever pull handle is in the latched position; and said switching member actuates said light barrier by shading a light path of said light barrier when said lever pull handle is in the latched position.

* * * * *